United States Patent
Park et al.

[11] Patent Number: 5,942,790
[45] Date of Patent: Aug. 24, 1999

[54] CHARGE EFFECT TRANSISTOR AND A METHOD FOR MANUFACTURING THE SAME

[75] Inventors: Kang Ho Park; Jeong Sook Ha, both of Daejon-Shi, Rep. of Korea

[73] Assignee: Electronics and Telecommunications Research Institute, Daejeon, Rep. of Korea

[21] Appl. No.: 09/136,612

[22] Filed: Aug. 20, 1998

[30] Foreign Application Priority Data

Aug. 30, 1997 [KR] Rep. of Korea ............ 97-43556

[51] Int. Cl.⁶ .................................................. H01L 29/47
[52] U.S. Cl. ............................ 257/471; 257/256; 257/261; 257/902
[58] Field of Search .................................. 257/256, 261, 257/262, 272, 329, 902, 471, 480

[56] References Cited

U.S. PATENT DOCUMENTS

| | | |
|---|---|---|
| 4,631,563 | 12/1986 | Iizuka ............................................. 257/902 |
| 4,647,954 | 3/1987 | Graf et al. ...................................... 257/276 |
| 4,691,215 | 9/1987 | Luryi . | 
| 5,049,953 | 9/1991 | Mihara et al. ................................. 257/328 |
| 5,428,234 | 6/1995 | Sumi .............................................. 257/902 |
| 5,705,827 | 1/1998 | Baba et al. ..................................... 257/289 |

*Primary Examiner*—David B. Hardy
*Attorney, Agent, or Firm*—Antonelli, Terry, Stout & Kraus, LLP

[57] ABSTRACT

A new conceptional transistor and a method for manufacturing, which increases the integration of semiconductor devices using conventional MOS devices are provided. The present invention provides a transistor in which a structure of metal-insulator film-metal dot-metal (MIMIM), metal-insulator film-metal dot-semiconductor (MIMS), or semiconductor-metal dot-semiconductor (SMS) is formed, using junction of electrodes operating as a source and a drain having a metal dot of nm therebetween, and the current flow between source and drain is controlled by controlling tunneling and Schottky barrier formed between the source and the metal dot using the method of controlling electrical potential of metal dot through charging effect of gate electrode isolated by a thick insulator.

6 Claims, 3 Drawing Sheets

CHARGE EFFECT TRANSISTOR AND A METHOD FOR MANUFACTURING THE SAME

BACKGROUND OF THE INVENTION

1. Field of the Invention

The present invention relates to a new conceptional transistor, which increases the integration of semiconductor device using the conventional MOS device, and its manufacturing method.

2. Description of the Related Art

In general, the microprocessor or unit device of memory (RAM) used in the computer uses the classical theory of transistor (MOS-FET) that forms inversion layer in the depletion layer of the semiconductor surface using field effects by gate voltage in the structure of Metal-Oxide-Semiconductor and controls the flow of current through channel of the inversion layer between the source and the drain by controlling the gate voltage. Because of the easy integration and the simple process of manufacturing, MOS-FETs are in the spotlight of basic unit device of very large scale integrated circuit over other kinds of transistors. Right now, the research and development of 1 Giga DRAM has already been under way. However, if the design rule becomes 0.1 $\mu$m (100 nm) or less, the transistor can not operate due to the short channel effect caused by the junction of the depletion layer between the source and the drain.

SUMMARY OF THE INVENTION

In order to overcome the design rule of 100 nm (a theoretical size limitation of MOSFET constituting unit transistor structure for achieving very large integration), it is needed to suggest a structure having a new principle and a conception, in which unit device of nm size can be operated. Also, the operational principle of transistor should not conflict with the occurrence of the quantum effect when the size of the device becomes quite small and it should be easy to manufacture the structure. Accordingly, the invention does not use the field effect inversion layer of semiconductor surface which is used in the MOSFET. Instead, the invention charges the metal dot of nano meter size which is insulated electrically with an insulation layer of 1 nm or Schottky barrier by controlling the voltage of gate electrode.

Therefore, the object of the invention is to provide a charge effect transistor and its method in which short channel effect does not appear and integration of the terabit level can be achieved reducing the size of unit device.

The charge effect transistor in accordance of the first embodiment of the invention includes a metal dot formed on a semiconductor substrate which operates as a drain, an oxide layer which is formed in the semiconductor substrate operating as the drain and overlaps the metal dot partially, a source which is formed on the semiconductor substrate operating as the drain and overlaps the metal dot partially, and a gate which is formed on the semiconductor substrate operating as the drain and is formed apart from the metal dot.

The charge effect transistor in accordance of the second embodiment of the invention includes a metal dot formed on a semiconductor substrate which operates as a drain, a insulator film which covers the upper part of the metal dot entirely, an oxide layer which is formed in the semiconductor substrate operating as the drain and overlaps the metal dot partially, a source which is formed on the semiconductor substrate operating as the drain and overlaps the insulator film partially, and a gate electrode which is formed on the semiconductor substrate operating as the drain and is formed apart from the metal dot.

The charge effect transistor in accordance of the third embodiment of the invention includes a metal dot formed on a metal substrate which operates as a drain, a insulator film which covers the upper part of the metal dot entirely, an oxide layer which is formed in the metal substrate operating as the drain and is formed thin under the metal dot, a source which is formed on the metal substrate operating as the drain and overlaps the insulator film partially, and a gate electrode which is formed on the metal substrate operating as the drain and is formed apart from the metal dot and the insulator film.

A method for manufacturing the charge effect transistor in accordance of the first embodiment of the invention includes the steps of forming a metal dot on the semiconductor substrate which operates as a drain, forming an oxide layer in the semiconductor substrate using the oxidization to overlap the metal dot, patterning a semiconductor part operating as a source using photolithography and etch processes to overlap the metal dot partially, and forming a gate electrode on the place apart from the metal dot.

A method for manufacturing the charge effect transistor in accordance of the second embodiment of the invention includes the steps of forming a metal dot on a semiconductor substrate which operates as a drain, forming a insulator film covering the upper part of the metal dot entirely, forming an oxide layer in the semiconductor substrate using the oxidation process to overlap the metal dot partially, patterning a metal layer operating as source using photolithography and etch processes to overlap the metal dot partially, and forming a gate electrode on the place apart from the metal dot.

A method for manufacturing the charge effect transistor in accordance of the third embodiment of the invention includes the steps of forming a thick oxide layer and a thin oxide layer in a metal substrate operating as a drain using oxidation process, forming a metal dot on the thin oxide layer, forming a insulator film on the upper part of the metal dot entirely, patterning a metal layer operating as a source using photolithography and etch processes to overlap the metal dot partially, and forming a gate electrode on the place apart from the metal dot.

BRIEF DESCRIPTION OF THE DRAWINGS

For fuller understanding of the nature and object of the invention, reference should be had to the following detailed description taken in conjunction with the accompanying drawings in which.

Similar reference characters refer to similar parts in the several views of the drawings.

DESCRIPTION OF THE PREFERRED EMBODIMENT

Figure 1:
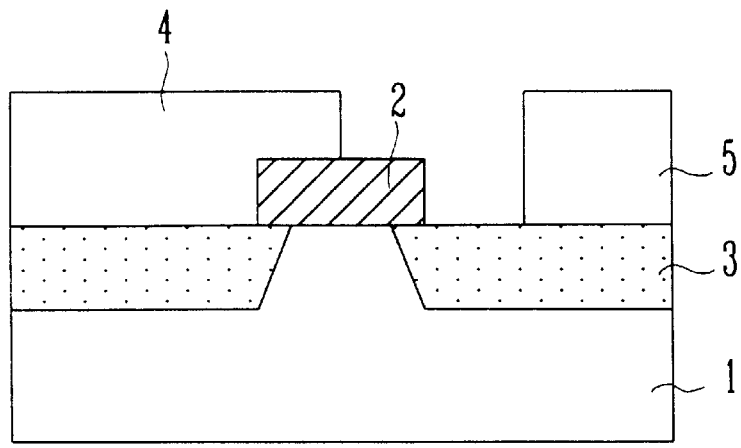
FIG. 1 shows a sectional view explaining a method for manufacturing a charge effect transistor having terabit integration level in accordance with the first embodiment of the invention.

Referring to FIG. 1, a metal dot 2 having a size of $10^{-8}$ to $10^{-9}$ m is formed on the n-type semiconductor substrate (drain 1) using one of the X-rays, an electron beam lithography and an atomic microscope (ATM/STM). Then, after forming a thick oxide layer 3 by oxidizing the semiconductor surface, a semiconductor-metal dot-semiconductor (SMS) structure is formed by patterning the n-type silicon (source 4) which has junction portion with a part of the metal dot 2 using lithography process. In order to charge the metal dot 2, a gate electrode 5 is formed in the $10^{-8}$ to $10^{-9}$ m apart from it.

Figure 2A:
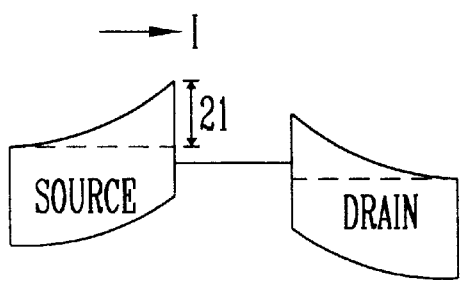
FIGS. 2a and 2b show views which illustrate the operations of the charge effect transistor having a terabit integration level in accordance with the first embodiment of the invention.
Figure 2B:
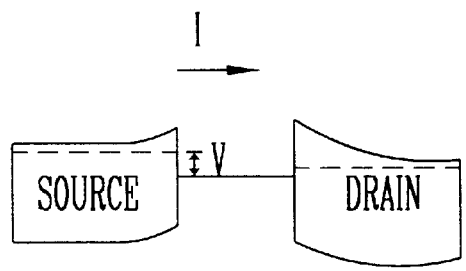

FIG. 2a shows a state in which little electron flows from the semiconductor substrate to the metal dot 2 since the barrier of the thermal electron emission is high due to the Schottky barrier 21 when gate voltage is not applied. FIG. 2b shows a state in which many electrons flow from the semiconductor substrate to the metal dot 2 since the potential barrier becomes low when the gate voltage is applied. In general, Schottky barrier 21 is formed by the depletion layer in the semiconductor when the metal and the semiconductor are connected together. Here, since there is electrical barrier of 0.3 to 1.0 eV in accordance with the doping level and the kind of metal in the case of silicon, little current flows even though the source and drain voltage (VDS) exists. However, when the gate voltage is applied, the current flows due to the potential difference between the metal dot and the gate electrode. The transistor structure of the invention uses a principle that the thermionic emission is increased suddenly due to the low potential barrier of the depletion layer of semiconductor by charging of the metal dot (FIG. 2b).

Figure 3:
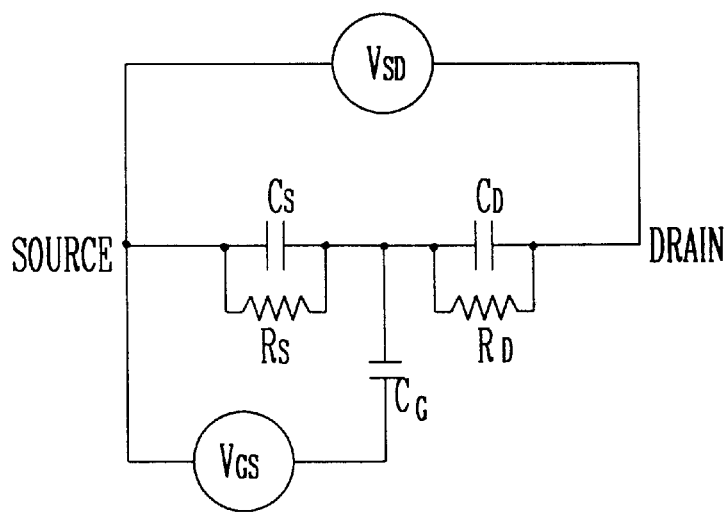
FIGS. 3 and 4 show views which illustrate the operations of the charge effect transistor having a terabit integration level in accordance with the invention.

Referring to FIG. 3, an equivalent circuit is shown in which a junction between the source 4, the metal dot 2 and the drain I are expressed as resistances ($R_S$, $R_D$) and capacitances ($C_S$ and $C_D$), and a junction between the metal dot 2 and the gate 5 is expressed as capacitance ($C_G$) only. Here, when the gate voltage ($V_{GS}$) is applied, the potential of metal dot 2 is changed and the current between the source and the drain is controlled as shown in FIG. 2b.

Figure 4:
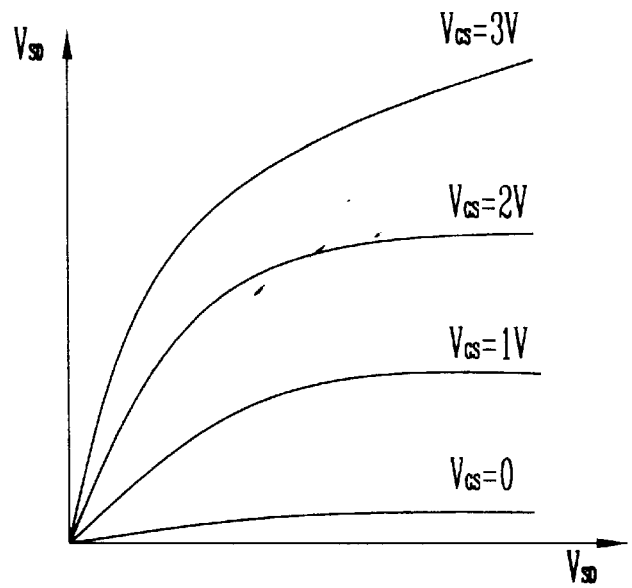

FIG. 4 shows a graph which depicts the variations of current by the voltages of source 4 and drain 1 as the gate voltage changes. As shown in FIG. 4, if $V_{GS}>0$ in the equivalent circuit, the thermionic emission is increased due to the low potential of metal dot 2 relatively by the gate electrode.

The thermionic emission which passes over the Schottky barrier from the semiconductor to the metal can be expressed as the equation 1.

$$J_{s \to m} = A^* T^2 \exp(-q\phi_B/kT) \exp(qV/kT) \qquad \text{[Equation 1]}$$

$A^*$ is Richardson Constant, T is absolute temperature, q is a charge quantity (–e in the case of electron), $\phi_B$ is Schottky barrier, k is Boltzmann constant, and V is a potential difference between the both terminals. The thermionic emission from the metal to the semiconductor can be expressed by substituting V=0 to the equation 1. However, the thermions which are passed over from the semiconductor (source 4) to the metal dot 2 pass over to the drain 1 directly as hot electrons without any impinging at the metal dot.

Also, the holes cause the current to flow as majority carriers in stead of electrons in the case of p-type semiconductor, the transistor operates in accordance with the above principlal, though energy diagram is different from FIGS. 2a and 2b.

Figure 5:
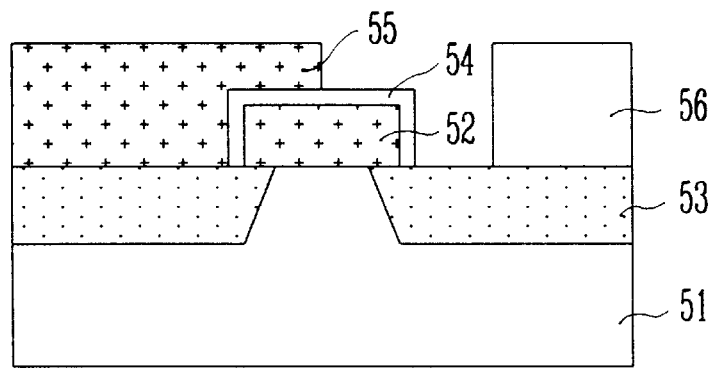
FIG. 5 shows a sectional view illustrating a method for manufacturing a charge effect transistor having a terabit integration level in accordance with the second embodiment of the invention.

Referring to FIG. 5, the tunneling effect can be achieved by substituting the metal for the source of semiconductor of FIG. 1 and by oxidizing the metal dot 52 under the thickness of 1 nm for the potential barrier. In the hetero-junction structure of metal-insulator film-metal dot-semiconductor shown in FIG. 5, the insulator film 54 between source 55 and the metal dot 52 is a tunneling barrier and the charging is performed by controlling the voltage of gate 56 different from the structure of semiconductor-metal dot-semiconductor. Also, in the structure, as the tunneling barrier is getting thinner by charging the metal dot 52, the Fowler-Nordheim tunneling becomes strong and the current flow between the source 55 and the drain 51 can be controlled.

Figure 6A:
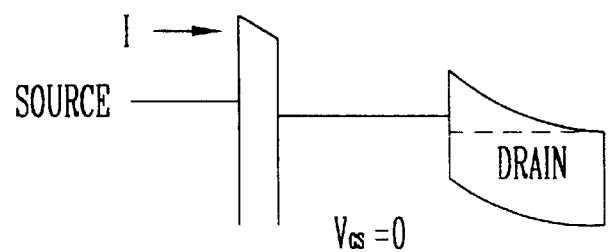
FIGS. 6a and 6b show views which illustrate the operation of the charge effect transistor having a terabit integration level in accordance with the second embodiment of the invention.
Figure 6B:
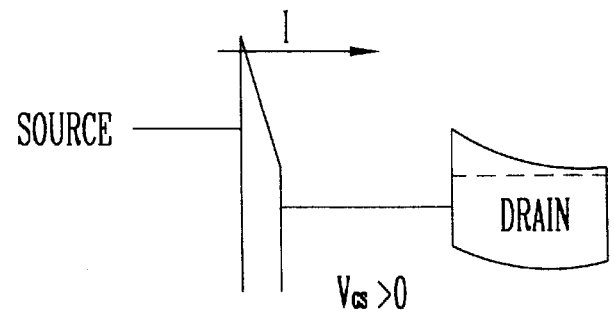

FIG. 6 shows the operational principle of transistor depicted in FIG. 5. Especially, FIG. 6a shows the state in which, when the gate voltage is not applied, the current I does not flow. Also, FIG. 6b shows the state in which the tunneling barrier becomes thinner when the gate voltage is applied, and the current I flows by the Fowler-Nordheim Tunneling.

Figure 7:
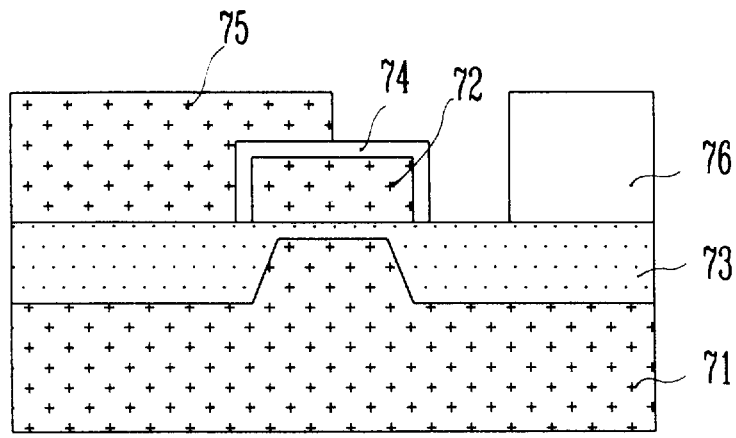
FIG. 7 shows a sectional view illustrating a method for manufacturing a charge effect transistor having a terabit integration level in accordance with the third embodiment of the invention.

FIG. 7 shows the structure which makes the tunneling possible by substituting metal for the semiconductor used as the drain 51 in FIG. 5 and by forming an insulator film 74 of 1 nm between the drain 75 and the metal dot 72. Here, the insulator film 74 between the source 75 and the metal dot 72 is a tunneling barrier and is charged by controlling the gate voltage. Also, as the tunneling barrier is getting thinner by charging the metal dot 72, the Fowler-Nordheim tunneling becomes strong and the current flow between the source 55 and the drain 51 can be controlled. In the case of charge effect transistor using the structure of metal-insulator film-metal dot-insulator film-metal shown in FIG. 7, the manufacturing of smaller unit device can be achieved since the depletion layer of several tens to several hundreds nm is not formed. That is, if the charged energy becomes higher than the thermal fluctuation energy kT due to the miniaturization of metal dot 72 and the resistance of each junction becomes higher than $h/2e^2$ (h: Flank's constant, e: charge of electron), the structure of the unit device becomes that of single electron device in which the charging and electric conduction of each electron can be controlled.

Figure 8A:
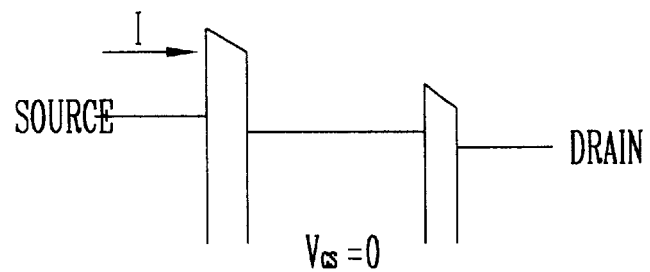
FIGS. 8a and 8b show views which illustrate the operation of the charge effect transistor having a terabit integration level in accordance with the third embodiment of the invention.
Figure 8B:
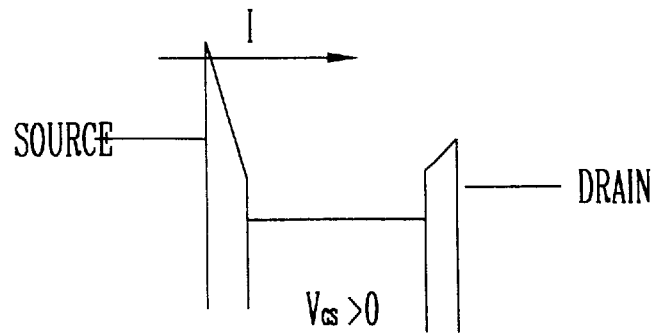

FIG. 8a shows operational principle of transistor structure shown in FIG. 7. Especially, FIG. 8a shows the state in which, when the gate voltage is not applied, the current I does not flow. Also, FIG. 8b shows the state in which, when the gate voltage is applied, the tunneling barrier becomes thinner and the current I flows by the Fowler-Nordheim Tunneling.

The charge effect transistor of the invention can be used as a simple transistor in which the electrical barrier between source and drain can be controlled by the charge effect using the metal dot of several to several tens nm as a gate. In addition, the transistor of the invention can be used as a single electron transistor if the temperature is lowered or the size of interposed metal dot becomes quite small.

The electrical control realm of the charge effect transistor can be reduced under several nm to several tens nm since the size of metal dot used as gate can be reduced under several nm to several tens nm and the electrical potential of the metal dot is controlled by the charge effect using gate voltage. Therefore, the short channel effect can be prohibited fundamentally, which occurs in the MOSFET used as an unit device in a very large scale integrated circuit. The transistor can be used as basic unit device which overcomes the design rule limitation of 0.1 nm and embodies terabit integration. Also, as the size of the device decreases, the current control speed increases and the power consumption can be reduced. Moreover the manufacturing cost can be reduced due to the easy of the manufacturing method.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expendient variations that may be made within the scope and spirit of the present invention are to be encompassed as further embodiments of the present invention.

What is claimed is:

1. A charge effect transistor comprising:

a metal dot formed on a semiconductor substrate which operates as a drain;

an oxide layer which is formed in the semiconductor substrate operating as the drain and overlaps the metal dot partially;

a source which is formed on the semiconductor substrate operating as the drain and overlaps the metal dot partially; and a gate which is formed on the semiconductor substrate operating as the drain and is formed apart from the metal dot.

2. A transistor claimed in claim 1, the size of metal dot is $10^{-8}$ to $10^{-9}$ m, the source is n-type silicon, and the distance between the gate electrode and the metal dot is $10^{-8}$ to $10^{-9}$ m.

3. A charge effect transistor comprising:

a metal dot formed on a semiconductor substrate which operates as a drain;

an insulator film which covers the upper part of the metal dot entirely;

an oxide layer which is formed in the semiconductor substrate operating as the drain and overlaps the metal dot partially;

a source which is formed on the semiconductor substrate operating as the drain and overlaps the insulator film partially; and a gate electrode which is formed on the semiconductor substrate operating as the drain and is formed apart from the metal dot.

4. A transistor claimed in claim 3, the size of metal dot is $10^{-8}$ to $10^{-9}$ m, the source is metal, and the distance between the gate electrode and the metal dot is $10^{-8}$ to $10^{-9}$ m.

5. A charge effect transistor comprising:

a metal dot formed on a metal substrate which operates as a drain;

an insulator film which covers the upper part of the metal dot entirely;

an oxide layer which is formed in the metal substrate operating as the drain and is formed thin under the metal dot;

a source which is formed on the metal substrate operating as the drain and overlaps the insulator film partially; and a gate electrode which is formed on the metal substrate operating as the drain and is formed apart from the metal dot and the insulator film.

6. A transistor claimed in claim 5, the size of metal dot is $10^{-8}$ to $10^{-9}$ m, the source is metal, and the distance between the gate electrode and the metal dot is $10^{-8}$ to $10^{-9}$ m.

* * * * *